(12) United States Patent
Takeuchi et al.

(10) Patent No.: US 6,680,123 B2
(45) Date of Patent: Jan. 20, 2004

(54) EMBEDDING RESIN

(75) Inventors: Hiroki Takeuchi, Komaki (JP);
Toshifumi Kojima, Komaki (JP);
Kazushige Obayashi, Nagoya (JP);
Hisahito Kashima, Nagoya (JP)

(73) Assignee: NGK Spark Plug Co., Ltd., Nagoya (JP)

(*) Notice: Subject to any disclaimer, the term of this patent is extended or adjusted under 35 U.S.C. 154(b) by 61 days.

(21) Appl. No.: 10/024,601

(22) Filed: Dec. 21, 2001

(65) Prior Publication Data
US 2002/0147264 A1 Oct. 10, 2002

(30) Foreign Application Priority Data

Dec. 25, 2000 (JP) .......... 2000-393600
Feb. 16, 2001 (JP) .......... 2001-040225
Nov. 19, 2001 (JP) .......... 2001-352496

(51) Int. Cl.⁷ .............. B32B 27/38
(52) U.S. Cl. ......... 428/413; 428/414; 428/418; 438/748; 361/748; 361/820; 361/821; 361/830; 257/793; 257/795; 257/796; 523/400; 524/495; 524/789
(58) Field of Search ............ 428/414, 419; 438/758; 361/748, 820, 821, 830; 257/793, 787, 788, 795, 796; 523/400; 524/495, 789

(56) References Cited

U.S. PATENT DOCUMENTS

| | | | | |
|---|---|---|---|---|
| 3,933,666 A | * | 1/1976 | Yoneno et al. | 252/62 |
| 4,600,766 A | * | 7/1986 | Arita et al. | 528/207 |
| 5,951,908 A | * | 9/1999 | Cui et al. | 252/62.9 R |
| 6,146,749 A | * | 11/2000 | Miyamoto et al. | 428/320.2 |
| 6,376,053 B1 | * | 4/2002 | Nakamura et al. | 428/209 |
| 2003/0045757 A1 | * | 3/2003 | Ishii et al. | 568/660 |

FOREIGN PATENT DOCUMENTS

| | | |
|---|---|---|
| JP | 4-356998 | 12/1992 |
| JP | 6-326472 | 11/1994 |
| JP | 7-263619 | 10/1995 |
| JP | 11-45955 | 2/1999 |
| JP | 11-54939 | 2/1999 |
| JP | 11-67961 | 3/1999 |
| JP | 11-74648 | 3/1999 |
| JP | 11-126978 | 5/1999 |
| JP | 11-307687 | 11/1999 |
| JP | 2000-124352 | 4/2000 |

* cited by examiner

Primary Examiner—Robert Dawson
Assistant Examiner—Christopher M. Keehan
(74) Attorney, Agent, or Firm—Morgan, Lewis & Bockius LLP

(57) ABSTRACT

An embedding resin embeds an electronic part in an object and has a dielectric constant of about 5 or less and tan δ of about 0.08 or less.

17 Claims, 9 Drawing Sheets

EMBEDDING RESIN

This application claims the benefit of Japanese Patent Application Nos. 2001-352496, 2001-40225 and 2000-393600 filed in Japan on Nov. 19, 2001, Feb. 16, 2001 and Dec. 25, 2000, respectively, which are hereby incorporated by reference.

BACKGROUND OF THE INVENTION

1. Field of the Invention

The present invention relates to an embedding resin used for embedding, into a wiring board, electronic parts such as chip capacitors, chip inductors, and chip resistors, and more particularly, to an embedding resin suitable for use in, for example, a multi-layer wiring board in which electronic parts are to be embedded, or a package for storing a semiconductor element.

2. Discussion of the Related Art

In recent years, various studies have been performed on multi chip modules (MCMs) in which a number of semiconductor elements are mounted on a build-up wiring board. Typically, by use of solder, electronic parts, such as chip capacitors, chip inductors, and chip resistors, are mounted on the surface of a wiring layer formed on the surface of the wiring board.

When electronic parts are mounted on the surface of the build-up wiring board, since the parts require predetermined regions for mounting, a limitation is imposed on miniaturization of the wiring board. Also, depending on the layout of wiring for surface mounting, parasitic inductance of the wiring, which is an undesirable property, becomes large, which hampers incorporation of such wiring boards into electronic devices of higher frequency.

In order to solve the aforementioned problems, various studies have been performed on the method for embedding electronic parts in a wiring board. Japanese Patent Application Laid-Open (kokai) No. 11-126978 discloses a method in which electronic parts are mounted by use of solder, in advance, on a wiring board having a transfer sheet formed from metallic foil, and then the parts are transferred. However, this method does not provide accuracy in positioning of the mounted parts.

Japanese Patent Application Laid-Open (kokai) No. 2000-124352 discloses a multi-layer wiring board in which an insulating layer is built up on electronic parts embedded on a core substrate. When electronic parts are embedded in a substrate such as a core substrate, a space between the substrate and the electronic parts is filled with an embedding resin, and an insulating layer and a wiring layer are built up on the substrate. The electrode of the electronic part thus, must be electrically connected to the wiring formed on the insulating layer, through a metalization technique such as electroless plating.

The embedding resin is desirably colored black in order to prevent random reflection of light, which would otherwise raise problems when a wiring pattern is formed on the built-up insulating layer through exposure and development, or to reduce non-uniformity in color of the resin during curing of the resin. Therefore, carbon or a similar material must be incorporated, as a coloring agent, into the resin.

However, when carbon, which is conductive, is excessively incorporated into the embedding resin, the insulating property of the resin is deteriorated. Therefore, it is important to design the method for coloring the resin black so that random reflection of light is prevented and non-uniformity in color of the resin is reduced during curing of the resin, with the insulating property between electronic parts or between wiring portions formed on the insulating layer being maintained.

A problem arises when a wiring board is used under high-frequency conditions in that there is loss of electrical signals in high-frequency regions. In order to reduce such loss of electrical signals, an embedding resin used for embedding electronic parts in the wiring board must have low dielectric constant and exhibit low dielectric loss.

SUMMARY OF THE INVENTION

Accordingly, the present invention is directed to an embedding resin that substantially obviates one or more of the problems due to the limitations and disadvantages of the related art.

An object of the present invention is to provide an embedding resin which attains a high mounting density of electronic parts included in a wiring board.

Another object of the present invention is to provide an embedding resin which exhibits excellent electrical properties, such as insulating property.

Yet another object of the present invention is to provide an embedding resin which prevents random reflection of light.

Yet another object of the present invention is to provide an embedding resin which reduces non-uniformity in color of the resin during curing thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the embedding resin embeds an electronic part in an object, the embedding resin having a dielectric constant of about 5 or less and tan δ of about 0.08 or less.

In another aspect, a wiring board in which electronic parts are embedded by use of an embedding resin includes a through hole formed on a core substrate; a backing tape applied on the core substrate; a plurality of capacitors mounted on an adhesive surface of the backing tape, wherein the embedding resin is fed into spaces between the through hole and the plurality of capacitors.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

As used herein, the expression "embedding an electronic part" refers to the case where an electronic part is placed in an opening (e.g., a through hole or a depression such as a cavity) provided in a substrate such as a core substrate or in a built-up insulating layer, and then a space formed between the electronic part and the opening is filled with an embedding resin. The opening may be a through hole formed in a substrate through punching, or a cavity formed by means of multi-layer lamination.

Figure 10:
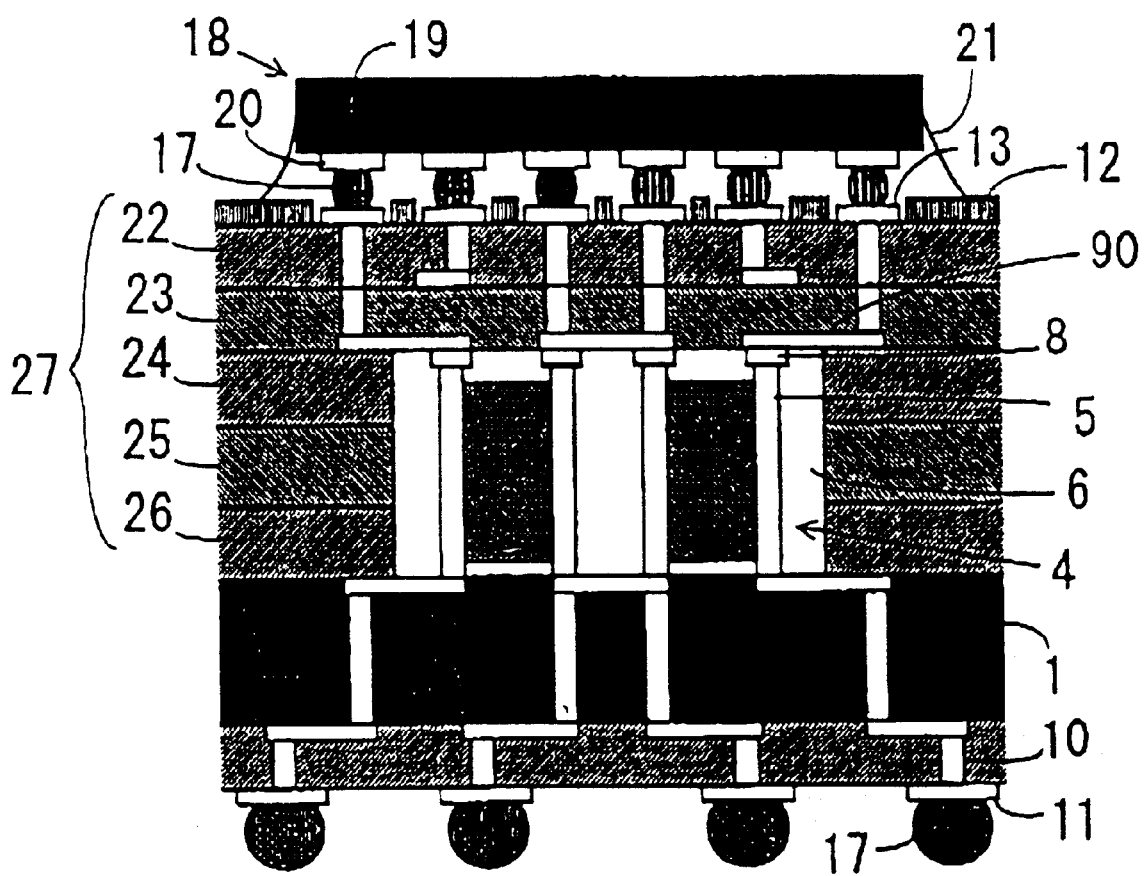
FIG. 10 is an explanatory view showing a BGA board formed from a wiring board making use of an embedding resin of the present invention.
Figure 11:
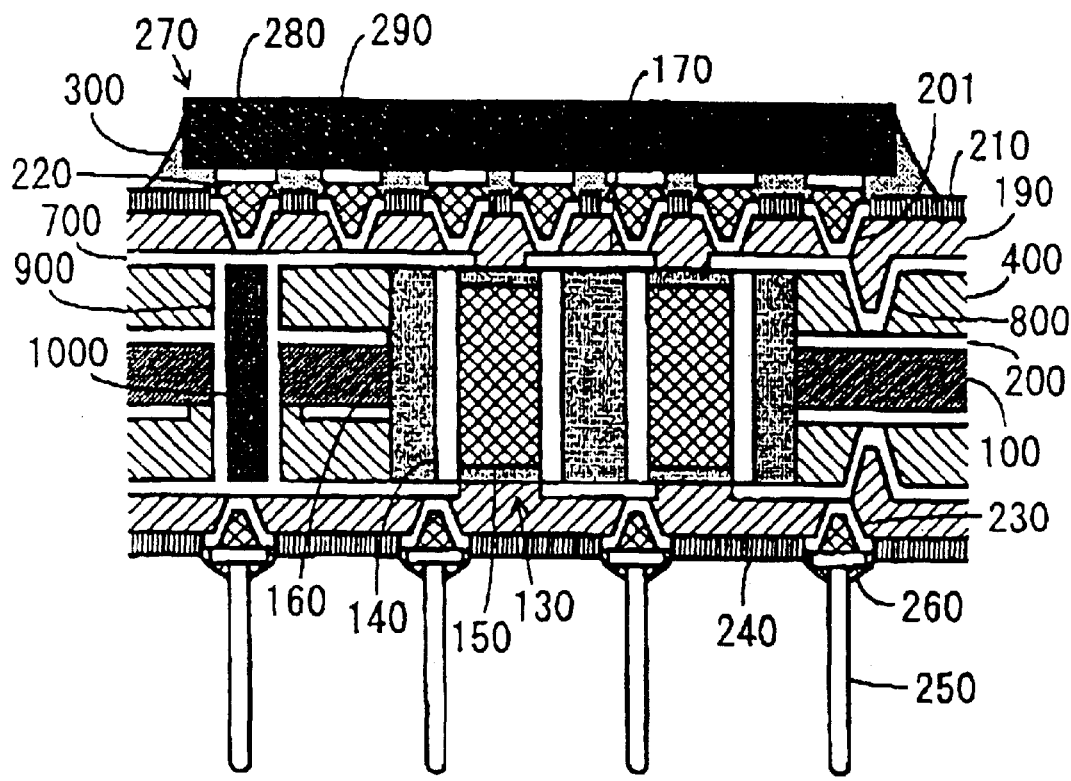
FIG. 11 is an explanatory view showing an embodiment of an FC-PGA-type multi-layer printed wiring board making use of an embedding resin of the present invention.

The substrate used in the present invention is preferably a core substrate, such as FR-4, FR-5, or BT. However, the substrate used in the present invention may be a substrate in which an opening is formed in a core substrate formed by sandwiching a copper foil having a thickness of about 35 $\mu$m between sheets of a thermoplastic resin such as PTFE. Alternatively, the substrate used in the present invention may be a substrate in which a build-up layer, which is formed by laminating an insulating layer and a wiring layer in alternating fashion, is formed on at least one surface of a core substrate, and an opening portion is formed so as to penetrate at least one of the core substrate and the build-up layer. When this substrate is employed for forming a multi-layer wiring board including capacitors as shown in FIG. 11, the thickness of the core substrate formed from, for example, a glass-epoxy composite material is advantageously reduced to about 400 $\mu$m (i.e., half the thickness of a typical core substrate (800 $\mu$m)). Therefore, the height of the wiring board can be reduced. In other example applications, this substrate can be employed for forming a wiring board including electronic parts embedded in a core substrate (see FIG. 1) or a wiring board including electronic parts embedded in a build-up layer (see FIG. 10).

Examples of the aforementioned electronic part include passive electronic parts such as chip capacitors, chip inductors, chip resistors, and filters; active electronic parts such as transistors, semiconductor elements, FETs, and low-noise amplifiers (LNAs); and other electronic parts such as SAW filters, LC filters, antenna switch modules, couplers, and diplexers.

When the dielectric loss of the embedding resin is large, transfer loss of electrical signals increases, which is not preferable. When tan δ of the embedding resin, which is an index of the degree of dielectric loss of the resin, is determined to be 0.08 or less, transfer loss of electrical signals can be reduced. In the present invention, tan δ is preferably 0.05 or less, more preferably 0.04 or less, much more preferably 0.03 or less, still more preferably 0.02 or less.

Particularly preferably, the embedding resin of the present invention contains carbon black formed of fine particles. Carbon black may be incorporated into the resin in an amount of 1.4 mass % or less. When carbon black is incorporated into the embedding resin, insulating reliability and dielectric properties of the resin can be improved, and there can be prevented random reflection of light can be prevented. These problems are raised in prior systems when a wiring pattern is formed through exposure and development on an insulating layer built up on the embedding resin. Further, non-uniformity in color of the resin can be reduced by the present invention during curing of the resin. Preferably, the amount of carbon black 1.0 mass % or less, since reduction of volume resistance of the resin can be prevented, to thereby improve electrical characteristics.

In order to effectively solve problems in relation to formation of a wiring pattern through exposure and development, carbon black is incorporated into the embedding resin in an amount of 0.1–1.4 mass %. The amount of carbon black is preferably 0.1–1.0 mass %, more preferably 0.1–0.5 mass %, much more preferably 0.1–0.3 mass %.

When the incorporation amount of carbon black exceeds 1.4 mass %, the dielectric properties and electrical characteristics of the embedding resin deteriorate drastically. Specifically, tan δ of the resin, which is an index of the degree of dielectric loss of the resin, exceeds 0.08, and the dielectric constant of the resin exceeds 5. In addition, the volume resistance of the resin, which is an index of insulating property of the resin, becomes less than $1.0 \times 10^{14}$ Ω·cm.

The embedding resin of the present invention may contain, as a resin component, at least a thermosetting resin, and at least one inorganic filler. When the embedding resin contains at least a thermosetting resin, the embedding resin can be easily cured through heat treatment after charging of the resin. When an epoxy resin is used as the thermosetting resin, epoxy groups may be directly subjected to cationic polymerization by use of a photo-polymerization initiator such as a dialuriodonium salt.

In order to perform pre-curing prior to main curing, the thermosetting resin may contain a photosensitive resin. For example, the thermosetting resin may contain a photosensitive resin having an acryloyl group. When an epoxy resin is used as the thermosetting resin, epoxy groups may be directly subjected to photo-polymerization by use of a photo-polymerization initiator, to thereby pre-cure the resin.

The thermosetting resin is preferably an epoxy resin. Specifically, the thermosetting resin is preferably at least one species selected from among a bisphenol-type epoxy resin, a naphthalene-type epoxy resin, a phenol-novolak-type epoxy resin, and a cresol-novolak-type epoxy resin. This is because, since a cured epoxy resin has a three-dimensional network structure, the cured embedding resin is not broken even after being subjected to roughing treatment, which is performed for improving the strength of adhesion between the resin and wiring by means of the anchor effect.

When the fluidity of the embedding resin is poor, a space between electrodes of an electronic part tends to be insufficiently filled with the resin, permitting local differences in thermal expansion coefficient of the resin. Particularly, in consideration of heat resistance and moisture resistance of the embedding resin, a naphthalene-type epoxy resin exhibiting excellent heat resistance and moisture resistance is preferably used in the embedding resin.

Roughing of the embedding resin is typically performed by means of a wet method making use of an oxidizing agent such as potassium permanganate or chromic acid. However, roughing of the embedding resin may be performed by means of a dry method making use of plasma, laser power, etc.

Incorporation of an inorganic filler into the embedding resin is advantageous in that the thermal expansion coefficient of the cured embedding resin can be regulated and breakage of the roughed embedding resin is prevented by virtue of the effect of the inorganic filler serving as an aggregate.

No particular limitation is imposed on the inorganic filler, but crystalline silica, fused silica, alumina, silicon nitride, etc. are preferred. When the inorganic filler is incorporated into the embedding resin, the thermal expansion coefficient of the resin can be effectively reduced. Therefore, reliability of the resin with respect to thermal stress can be improved.

The particle size of the inorganic filler is preferably 50 μm or less, since a space between electrodes of an electronic part must be easily filled with the embedding resin. When the particle size exceeds 50 μm, a space between electrodes of an electronic part tends to be stuffed with the filler, and the space is insufficiently filled with the embedding resin, so that thermal expansion coefficient of the resin differs greatly from portion to portion. The lower limit of the particle size of the filler is preferably at least 0.1 μm. When the particle size is less than 0.1 μm, fluidity of the embedding resin may fail to be maintained. The particle size of the filler is preferably at least 0.3 μm, more preferably at least 0.5 μm. In order to lower the viscosity of the embedding resin and to fill the space with the resin sufficiently, distribution of the particle size is preferably widened.

In consideration of high fluidity and filling ability of the embedding resin, preferably the inorganic filler assumes substantially a spherical shape. Particularly, a silica-based inorganic filler is preferred, since a spherical silica-based inorganic filler is easily available.

If desired, the inorganic filler may be subjected to surface treatment by use of a coupling agent. This is because, when the inorganic filler is subjected to surface treatment, wettability between the inorganic filler and a resin component is improved, and fluidity of the embedding resin can be improved. Examples of the coupling agent employed include a silane-based coupling agent, a titanate-based coupling agent, and an aluminate-based coupling agent.

In order to effectively avoid the aforementioned problems in relation to formation of a wiring pattern through exposure and development, the embedding resin of the present invention may be colored. This is because coloring the resin prevents random reflection of light, which would otherwise raise problems during formation of a wiring pattern on an insulating layer through exposure and development when, the insulating layer is built up on the embedding resin. Moreover, non-uniformity in color of the resin can be reduced during curing of the resin. No particular limitation is imposed on the color of the embedding resin, but preferably the base color of the resin is any one selected from among black, blue, green, red, orange, yellow, and violet. When prevention of random reflection of light is an issue of particular importance, the base color of the resin is preferably black, blue, or green, with black being particularly preferred.

When the embedding resin is colored black, the following substances can be incorporated into the embedding resin: black carbonaceous powder such as carbon black, graphite, or a mixture of carbon black and graphite; powder of a black inorganic oxide such as $Cu_2O$, $CuO$, or $MnO_2$; and an azomethine-based black organic pigment such as Chromofine Black A1103.

Examples of the substance for imparting a blue color to the embedding resin include phthalocyanine-based pigments such as Phthalocyanine Blue; azo pigments such as Variamine Blue; organic pigments including anthraquinone-based pigments such as Anthraquinone Blue; and inorganic oxides such as ultramarine and cobalt blue.

Examples of the substance for imparting a green color to the embedding resin include phthalocyanine-based pigments such as Phthalocyanine Green; azo pigments such as Chrome Green; organic pigments including triphenyhnethane-based pigments such as Malachite Green; and powder of inorganic oxides such as $Cr_2O_3$.

Examples of the substance for imparting a red color to the embedding resin include azo pigments such as Azo Eosine, Azo Naphthol Red, and Lithol Red; organic pigments such as quinacridone and dianthraquinonyl red; and powder of inorganic oxides such as red iron oxide and cadmium red.

Examples of the substance for imparting an orange color to the embedding resin include azo pigments such as Chrome Orange; organic pigments such as benzimidazolone; and inorganic oxides such as molybdate orange.

Examples of the substance for imparting a yellow color to the embedding resin include azo pigments such as Chrome Yellow and Hansa Yellow; quinoline-based pigments such as Quinoline Yellow; anthraquinone-based pigments such as Anthraquinone Yellow; organic pigments such as benzimidazolone and isoindolinone; and powder of inorganic oxides such as cadmium yellow, chrome yellow, and Titan Yellow.

Examples of the substance for imparting a violet color to the embedding resin include anthraquinone-based pigments such as Anthraquinone Violet; organic pigments including triphenylmethane-based pigments such as Mitsui Crystal Violet; and powder of inorganic oxides such as manganese violet.

In order to cause the embedding resin to assume any base color selected from among black, blue, green, red, orange, yellow, and violet, a coloring agent may be used alone. Alternatively, coloring agents of various colors may be used in combination. In this case, pigments of red, yellow, and blue (i.e., the three primary colors) are preferably used in combination, since the embedding resin can be caused to assume any desired color.

When a coloring agent, other than a conductive coloring agent such as carbon black, is incorporated into the embedding resin, the incorporation amount of the coloring agent is appropriately determined so as to attain a desired color suitable for the production process of a wiring board so that random reflection of light can be prevented or non-uniformity in color of the resin during curing thereof can be reduced.

A wiring board in which electronic parts are embedded by use of the embedding resin of the present invention exhibits excellent heat-cycle resistance and connection reliability. Specifically, flip chip packages including capacitors shown in FIGS. 1 and 10 can be produced by use of the embedding resin. In addition to bump-grid-array-type packages shown in FIGS. 1 and 10, pin-grid-array-type packages can be produced by use of the embedding resin.

Figure 1:
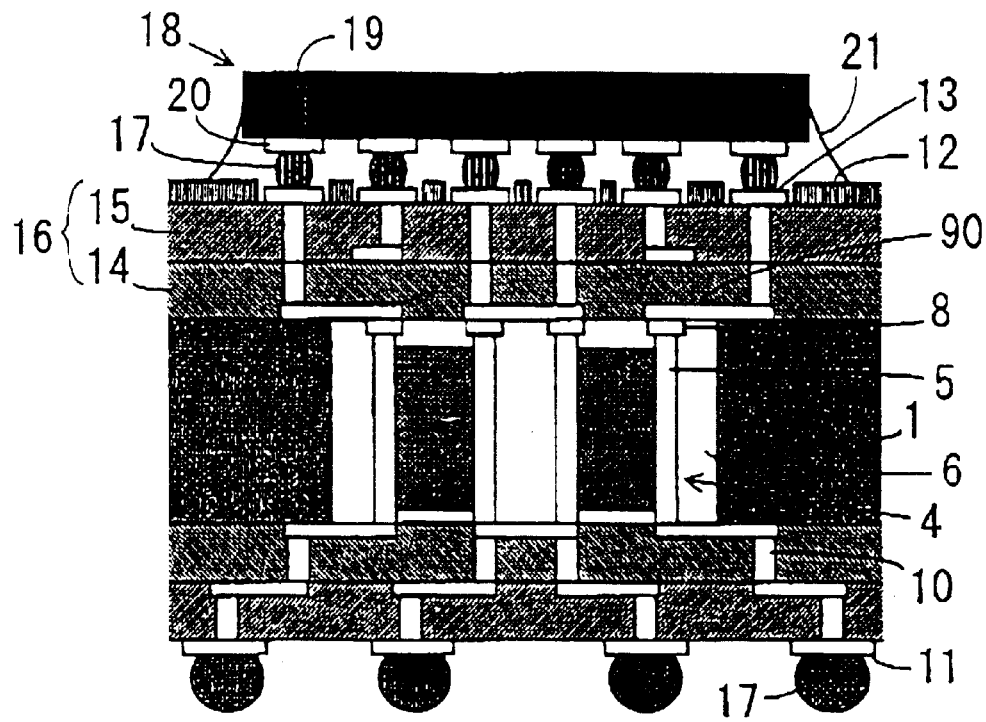
FIG. 1 is an explanatory view showing a BGA board formed from a wiring board making use of the embedding resin of the present invention.
Figure 2:
FIG. 2 is an explanatory view showing an embodiment of the production process of a wiring board making use of the embedding resin of the present invention.

A wiring board in which the embedding resin of the present invention is employed, shown in FIG. 1, can be produced through the below-described process. As shown in FIG. 2, a through hole (opening: 2) of predetermined size is formed in a core substrate (1) by use of a die; a backing tape (3) is applied onto a first surface of the core substrate; and the core substrate is placed such that the backing tape is located below the core substrate.

Figure 3:
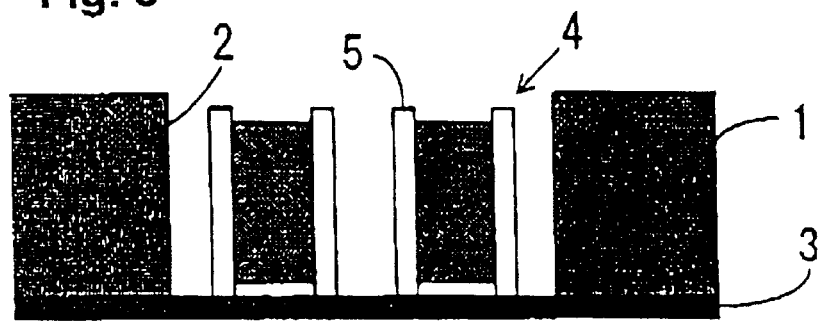
FIG. 3 is an explanatory view showing the embodiment of the production process of the wiring board making use of the embedding resin of the present invention.
Figure 4:
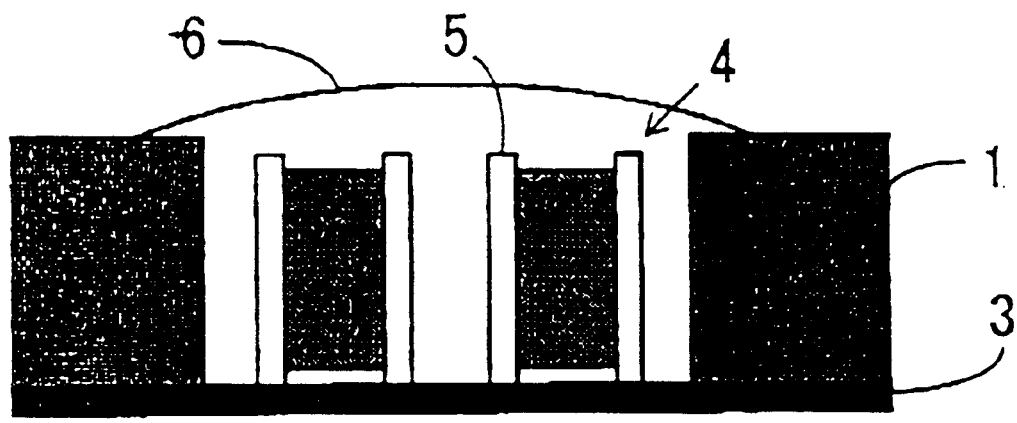
FIG. 4 is an explanatory view showing the embodiment of the production process of the wiring board making use of the embedding resin of the present invention.

As shown in FIG. 3, chip capacitors (4) are mounted on predetermined positions of an adhesive surface of the backing tape (3) by use of a chip mounter, the surface being located in the opening (2). In order to embed the chip capacitor in an embedding resin effectively, the chip capacitor preferably has electrodes (5) projecting from the capacitor main body. As shown in FIG. 4, by use of a dispenser an embedding resin of the present invention (6) is fed into spaces between the opening (2) and the chip capacitors (4) provided in the opening (2).

Figure 5:
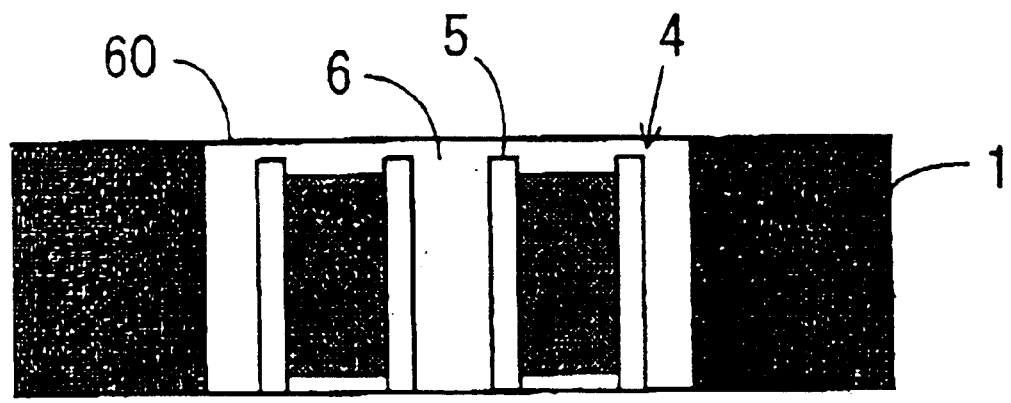
FIG. 5 is an explanatory view showing the embodiment of the production process of the wiring board making use of the embedding resin of the present invention.

The embedding resin (6) is subjected to defoaming and curing at 100° C. for 80 minutes, at 120° C. for 60 minutes, and at 160° C. for 10 minutes. The surface of the cured embedding resin (6) is subjected to rough polishing by use of a belt sander, and then finished through lap polishing. FIG. 5 shows the surface (60) of the embedding resin (6) after polishing.

Figure 6:
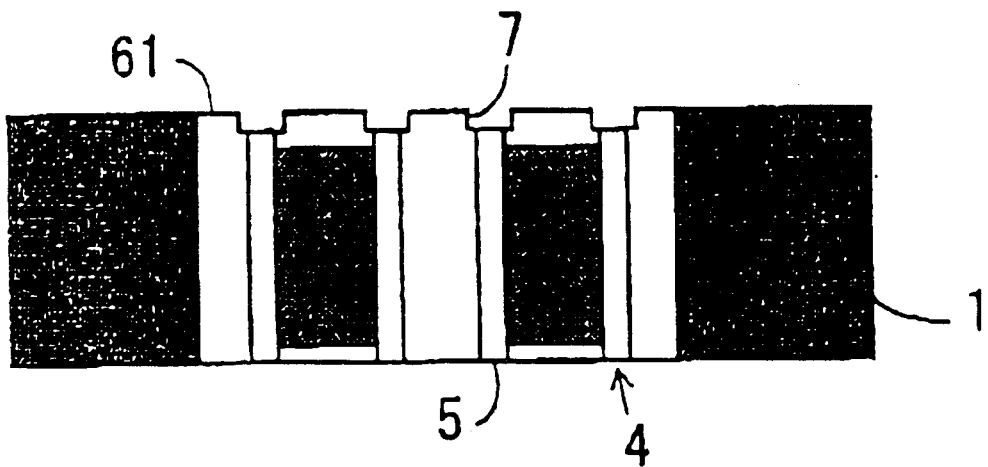
FIG. 6 is an explanatory view showing the embodiment of the production process of the wiring board making use of the embedding resin of the present invention.

Subsequently, as shown in FIG. 6, via holes (7) are formed by means of a carbon dioxide gas laser, to thereby expose the electrodes (5) of the chip capacitors (4).

Figure 7:
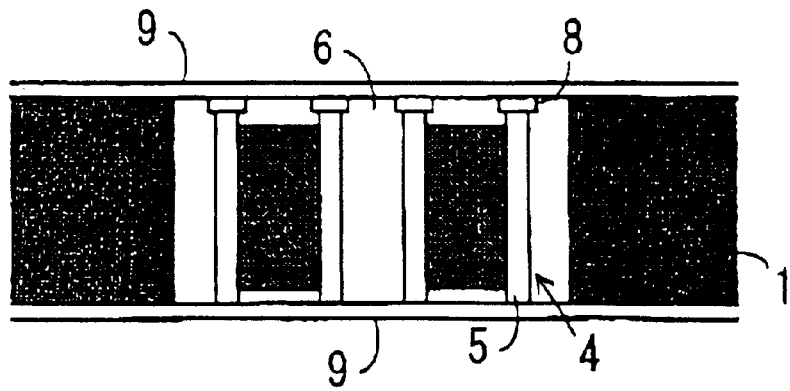
FIG. 7 is an explanatory view showing the embodiment of the production process of the wiring board making use of the embedding resin of the present invention.
Figure 8:
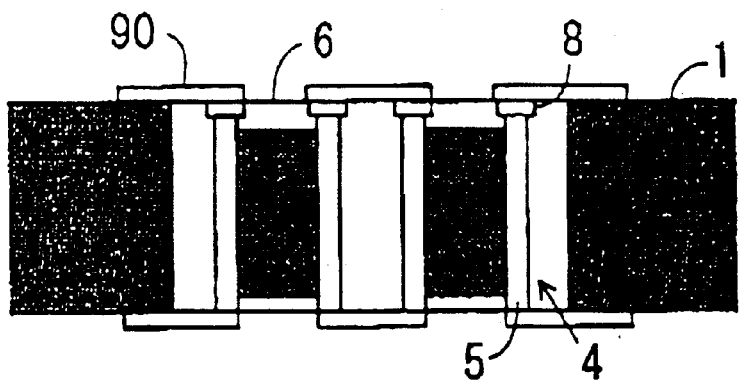
FIG. 8 is an explanatory view showing the embodiment of the production process of the wiring board making use of the embedding resin of the present invention.

Thereafter, an exposure surface (61) of the embedding resin (6) is roughed by use of a swelling solution and a $KMnO_4$ solution. After the roughed surface is activated by use of a Pd catalyst, the surface is subjected to electroless plating and then electroplating, to thereby form a copper plating layer (9). FIG. 7 shows the state after copper plating. A resist (not illustrated) is formed on the plating layer, and a predetermined wiring pattern is formed through patterning. Unwanted copper is removed through etching by use of $Na_2S_2O_8$/concentrated sulfuric acid. Subsequently, the resist is removed, to thereby complete formation of wiring (90). FIG. 8 shows the state after formation of the wiring.

Figure 9:
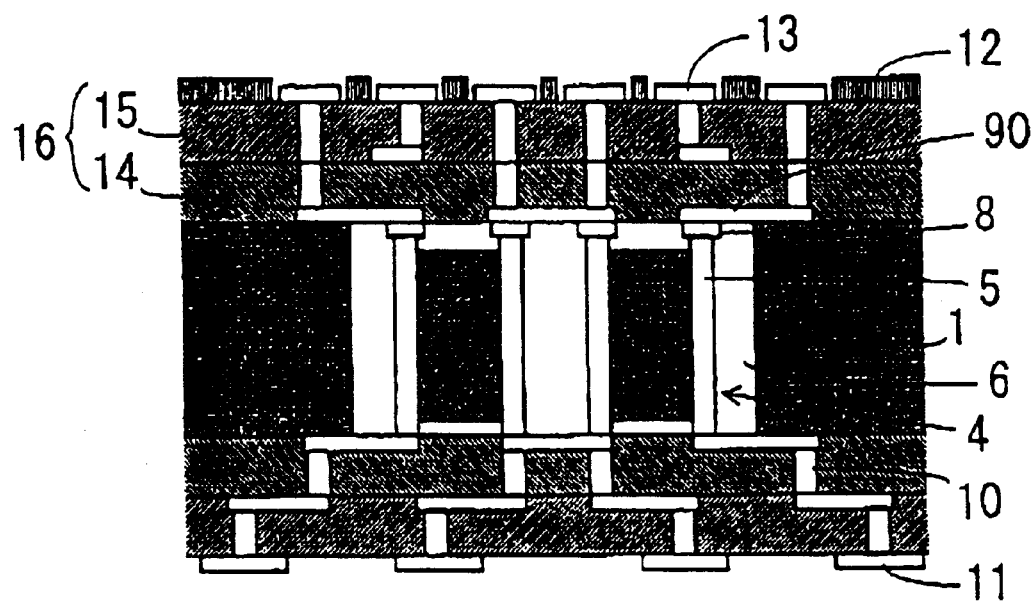
FIG. 9 is an explanatory view showing the embodiment of the production process of the wiring board making use of the embedding resin of the present invention.

On the wiring, films (14, 15) to serve as insulating layers are laminated, and then cured through heating. Thereafter, the films are irradiated with a laser, to thereby form via holes for connecting the layers. The surface of the outer insulating layer is roughed by use of the aforementioned oxidizing agent, and a predetermined wiring pattern is formed on the insulating layer in a manner similar to that described above. A dry film, which is to serve as a solder resist layer, is laminated on the outermost surface of the wiring substrate, and a mounting pattern of a semiconductor element is formed on the dry film through exposure and development, to thereby form a solder resist layer (12). FIG. 9 shows the state after formation of the solder resist layer. Terminal electrodes (13) on which a semiconductor element is to be mounted are subjected to Ni plating and then Au plating. Thereafter, a semiconductor element (18) is mounted on the terminal electrodes through use of a solder reflow furnace. Before the element is mounted, solder balls (17) are formed on the electrodes by use of low-melting-point solder. Spaces between solder balls are filled with an underfill material (21) by use of a dispenser, and the material is cured through heating, to thereby produce the intended wiring substrate shown in FIG. 1.

The following process may be used to produce a multi-layer wiring board including a substrate in which a build-up layer, which is formed by laminating an insulating layer and a wiring layer alternately, is formed on at least one surface of a core substrate, and an opening is formed so as to penetrate the core substrate and the build-up layer (see FIGS. 11 through 25). The production process of a wiring board having an "FC-PGA" structure shown in FIG. 11 will next be described.

Figure 12:
FIG. 12 is a schematic representation of a copper-applied core substrate having a thickness of 400 $\mu$m according to the present invention.
Figure 13:
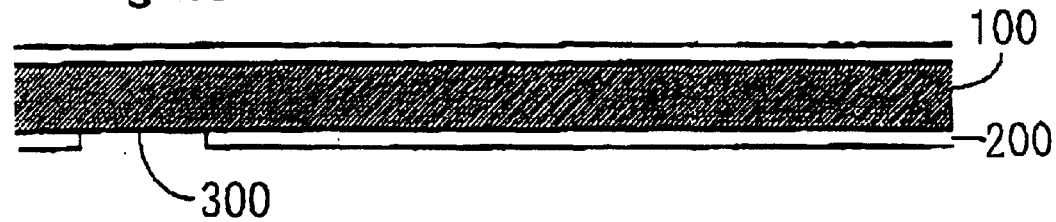
FIG. 13 is an explanatory view showing the state after the copper-applied core substrate having a thickness of 400 $\mu$m has been subjected to patterning according to the present invention.

As shown in FIG. 12, a core substrate including an FR-5-made insulating substrate (100) (thickness: 0.4 mm) and copper foil (200) (thickness: 18 μm) applied on respective surfaces of the insulating substrate is prepared. Properties of the core substrate are as follows: glass transition temperature (Tg) as measured by means of TMA is 175° C.; coefficient of thermal expansion (CTE) in a direction parallel to the substrate surface is 16 ppm/° C.; coefficient of thermal expansion (CTE) in a direction perpendicular to the substrate surface is 50 ppm/° C.; dielectric constant ($\epsilon$) at 1 MHz is 4.7; and tan $\delta$ at 1 MHz is 0.018.

A photoresist film is applied onto the core substrate, and then subjected to exposure and development, to thereby form an opening having a diameter of 600 $\mu$m and another opening (not illustrated) corresponding to a predetermined wiring shape. The copper foil exposed to the opening of the photoresist film is removed through etching by use of an etching solution containing sodium sulfite and sulfuric acid. Subsequently, the photoresist film is exfoliated, to thereby obtain a core substrate having an exposure portion (300) shown in FIG. 13 and another exposure portion (not illustrated) corresponding to a predetermined wiring shape.

The core substrate is subjected to etching by use of a commercially available etching apparatus (CZ treatment apparatus, product of Mec), to thereby rough the surface of the copper foil. Thereafter, an insulating film predominantly containing an epoxy resin (at a thickness of about 35 $\mu$m) is applied onto both surfaces of the core substrate. Subsequently, the film is cured at 170° C. for 1.5 hours to thereby form an insulating layer. Properties of the cured insulating layer are as follows: glass transition temperature (Tg) as measured by means of TMA is 155° C.; glass transition temperature (Tg) as measured by means of DMA is 204° C.; coefficient of thermal expansion (CTE) is 66 ppm/° C.; dielectric constant ($\epsilon$) at 1 MHz is 3.7; tan $\delta$ at 1 MHz is 0.033; percent weight loss at 300° C. is 0.1%; percent water absorption is 0.8%; moisture absorption percentage is 1%; Young's modulus is 3 GHz; tensile strength is 63 MPa; and percent expansion is 4.6%.

Figure 14:
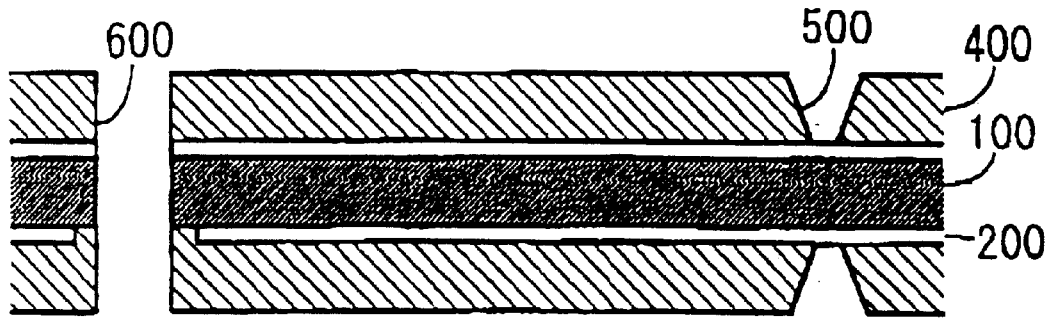
FIG. 14 is an explanatory view showing the state after via holes and a through hole have been formed in a substrate including the core substrate and insulating layers formed on both surfaces of the core substrate according to the present invention.

As shown in FIG. 14, a via hole (500) for connecting layers is formed in the insulating layer (400) by use of a carbon dioxide gas laser. The via hole assumes a mortar-like shape, and has a top diameter of 120 $\mu$m and a bottom diameter of 60 $\mu$m. Furthermore, by use of a carbon dioxide gas laser of high power, a through hole (600) (with a diameter of about 300 $\mu$m) is formed so as to penetrate the insulating layer (400) and the core substrate. The inner wall surface of the through hole assumes a wavy form (not illustrated) attributed to laser processing. Subsequently, the substrate is soaked in a catalyst activation solution containing palladium chloride, and then the entire surface of the substrate is subjected to electroless copper plating (not illustrated).

Subsequently, the entire surface of the substrate is subjected to copper panel plating, to thereby form a copper layer (700) (at a thickness about 18 $\mu$m). Through copper plating, a via hole conductor (800) for electrically connecting layers is formed in the via hole (500). In addition, a through hole conductor (900) for electrically connecting the top and bottom surfaces of the substrate is formed in the through hole (600). The resultant substrate is subjected to etching by use of a commercially available etching apparatus (CZ treatment apparatus, product of Mec), to thereby rough the surface of the copper layer. Thereafter, the substrate is subjected to rust preventive treatment (trademark: CZ treatment) making use of a rust preventive agent produced by Mec, to thereby form a hydrophobic surface. The contact angle (2θ) of the hydrophobic surface with respect to water as measured through a sessile drop method making use of a contact angle measurement apparatus (product name: CA-A, product of Kyowa Interface Science Co., Ltd.) Y.

Unwoven paper is provided on a pedestal equipped with a vacuum suction apparatus, and the above-treated substrate is placed on the pedestal. A stainless steel mask having a through hole whose position corresponds to the position of the through hole (600) is provided on the substrate. Subsequently, a paste containing a copper filler is placed on the mask, and the through hole (600) is filled with the paste by use of a roller-type squeegee under pressurization.

Figure 15:
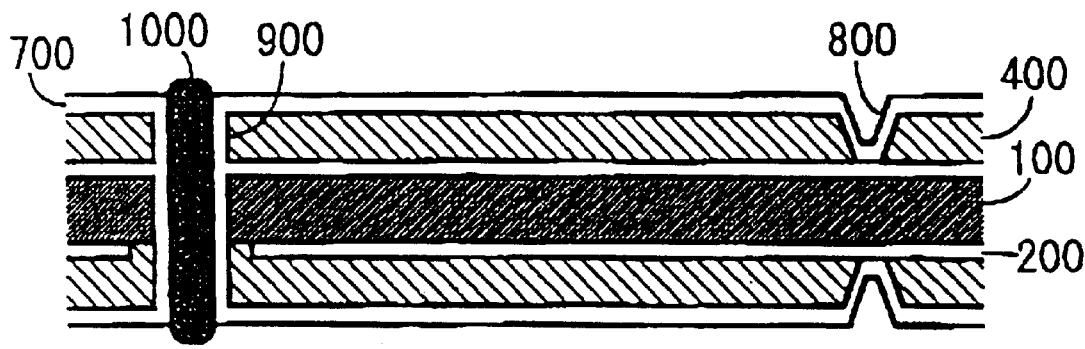
FIG. 15 is an explanatory view showing the state after the substrate including the core substrate and the insulating layers formed on both surfaces of the core substrate has been subjected to panel plating according to the present invention.
Figure 16:
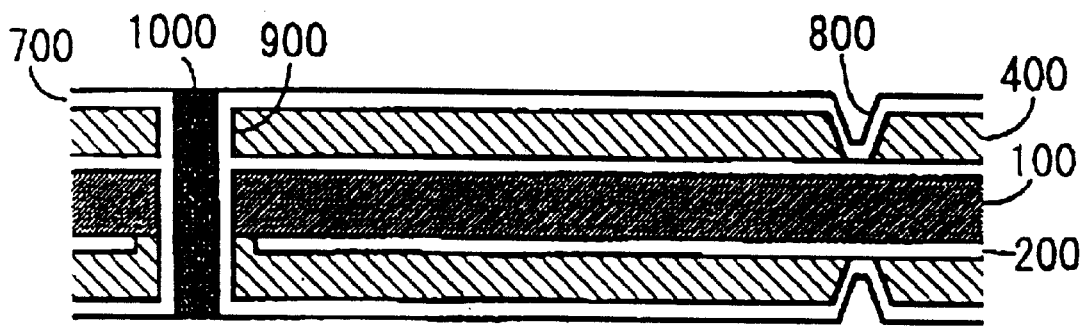
FIG. 16 is an explanatory view showing the substrate in which the through hole is filled with an embedding resin according to the present invention.

As shown in FIG. 15, the paste (1000) in the through hole (600) is pre-cured at 120° C. for 20 minutes. Subsequently, as shown in FIG. 16, the surface of the substrate is subjected to polishing (rough polishing) by use of a belt sander, and then subjected to buffing (finishing polishing), to thereby planarize the surface. Subsequently, the paste is cured at 150° C. for five hours, to thereby complete the step of embedding the through hole.

Figure 17:
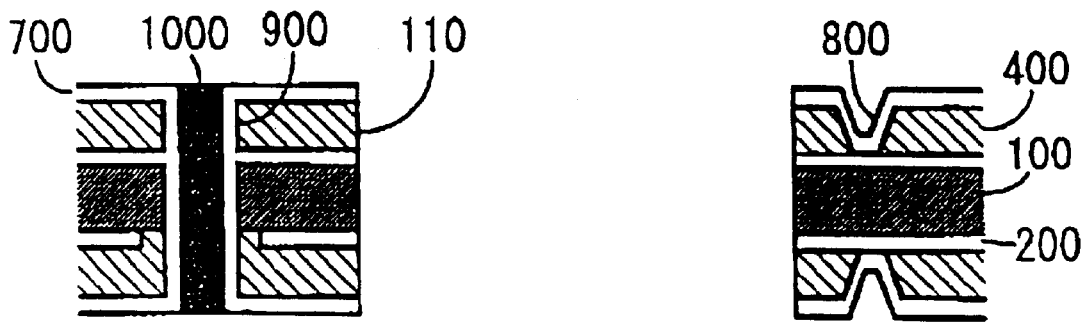
FIG. 17 is an explanatory view showing the substrate having a through hole formed through punching according to the present invention.
Figure 18:
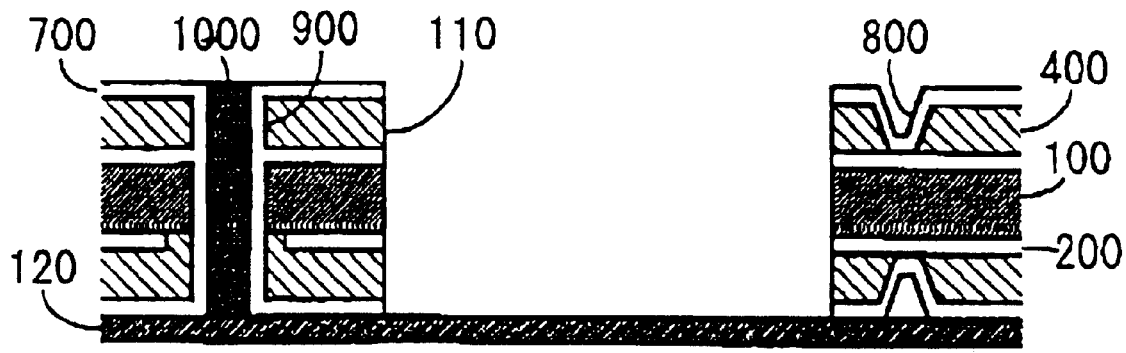
FIG. 18 is an explanatory view showing the state after a masking tape has been applied onto one surface of the substrate having the through hole formed through punching according to the present invention.
Figure 19:
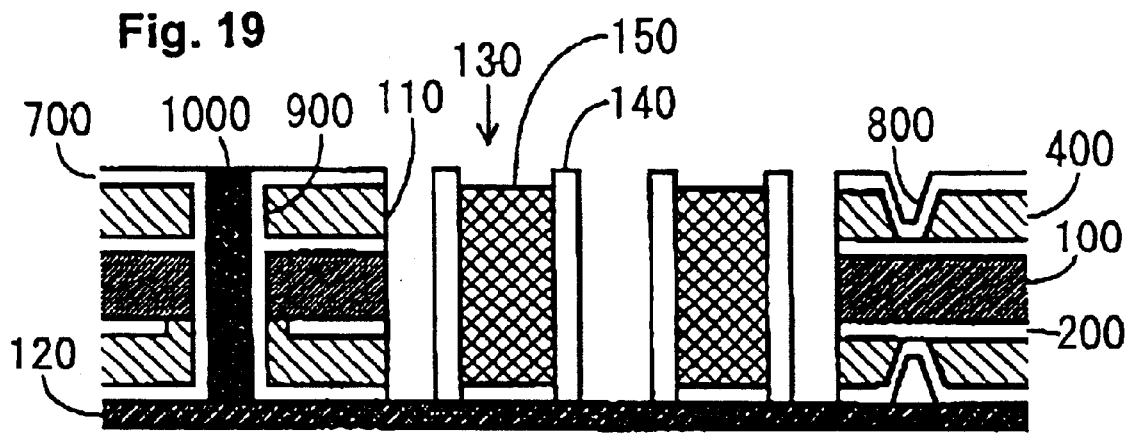
FIG. 19 is an explanatory view showing the state after laminated chip capacitors have been disposed on a portion of the masking tape, the portion being provided in the through hole according to the present invention.

As shown in FIG. 17, a square through hole (110) (at a size of about 8 mm×8 mm) is formed by use of a die (not illustrated). Subsequently, as shown in FIG. 18, a masking tape (120) is applied onto the bottom surface of the substrate. Subsequently, as shown in FIG. 19, eight laminated chip capacitors (130) are mounted on a portion of the masking tape (120) by use of a chip mounter, the portion being located in the through hole (110). Each of the laminated chip capacitors includes a laminated body (150) having dimensions of 1.2 mm×0.6 mm×0.4 mm and electrodes (140), each electrode having a height 70 $\mu$m greater than that of the laminated body.

Figure 20:
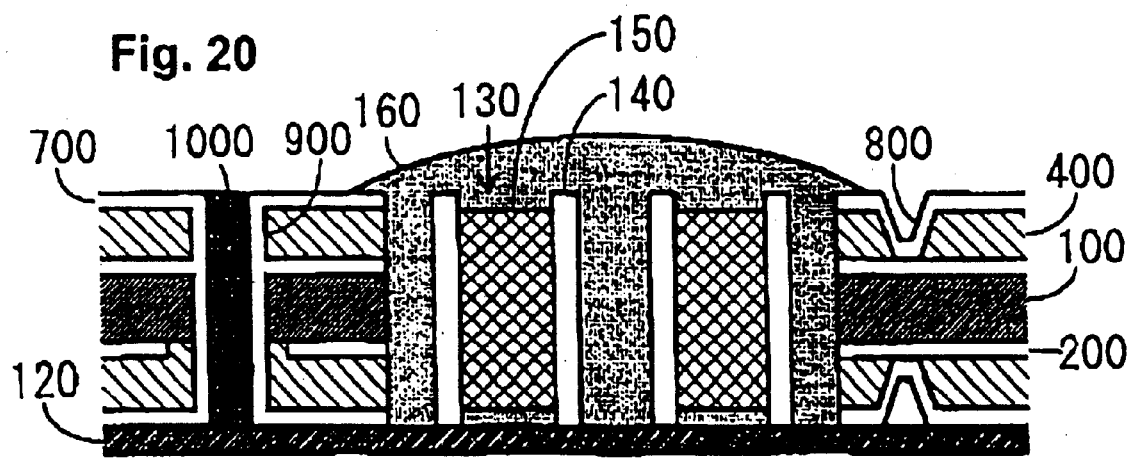
FIG. 20 is an explanatory view showing the state after the through hole has been filled with an embedding resin according to the present invention.

As shown in FIG. 20, by use of a dispenser (not illustrated), the through hole (110) in which the laminated chip capacitors (130) are provided is filled with an embedding resin (160) of the present invention. The embedding resin is subjected to defoaming and curing by the following steps: a primary heating step (80° C.×three hours) and a secondary heating step (170° C.×six hours).

Figure 21:
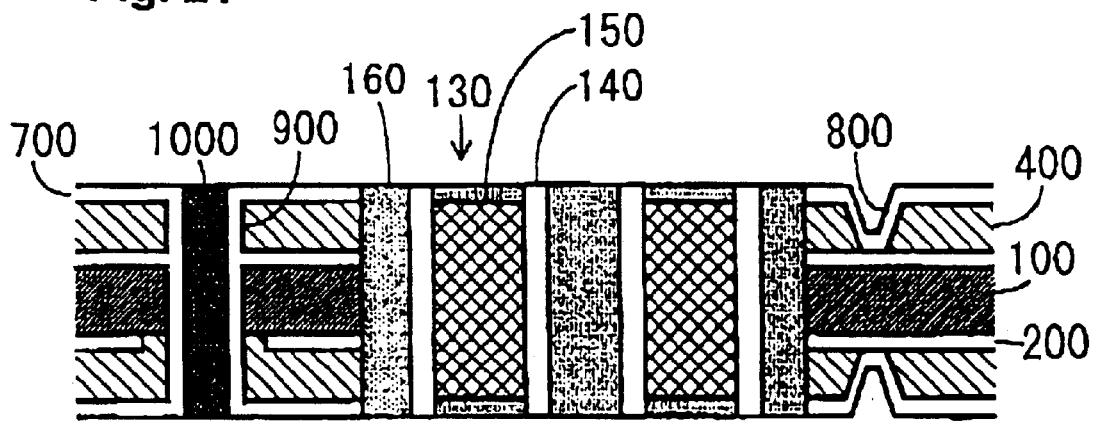
FIG. 21 is an explanatory view showing the state after the surface of the substrate has been planarized through polishing according to the present invention.

As shown in FIG. 21, the surface of the cured embedding resin (160) is subjected to rough polishing by use of a belt sander, and then finished through lap polishing. The end surfaces of the electrodes (140) of the chip capacitors (130) are exposed to the polished surface of the embedding resin. Subsequently, the pre-cured embedding resin (160) is cured at 150° C. for five hours.

Figure 22:
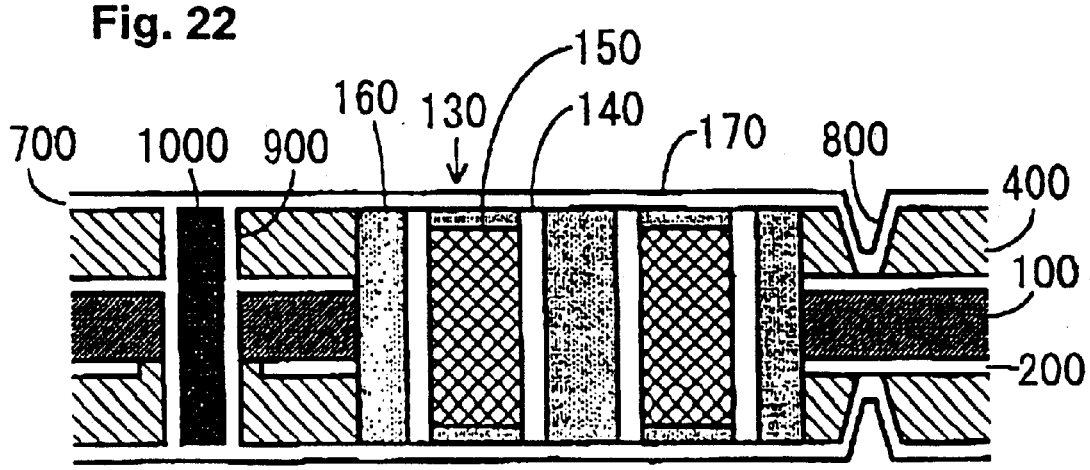
FIG. 22 is an explanatory view showing the state after the polished surface of the substrate has been subjected to panel plating according to the present invention.
Figure 23:
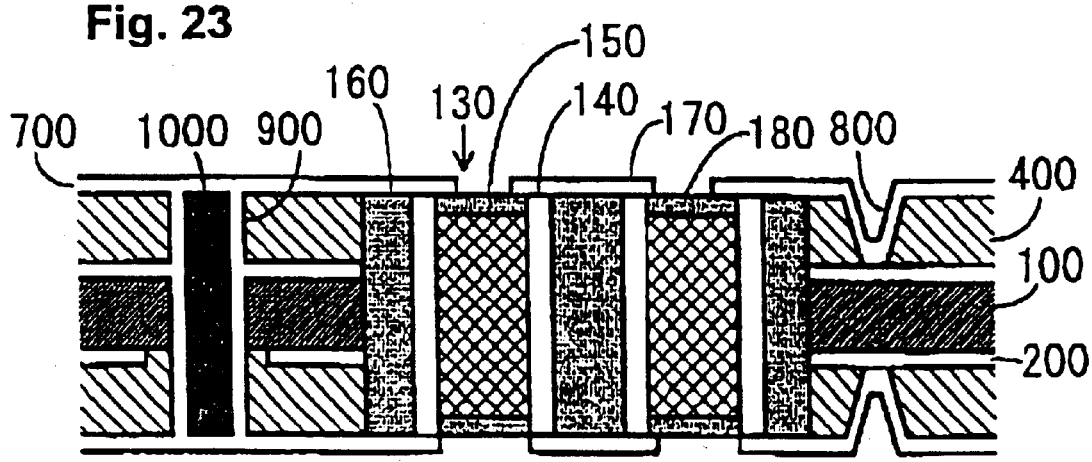
FIG. 23 is an explanatory view showing the state after wiring has been formed through patterning according to the present invention.
Figure 24:
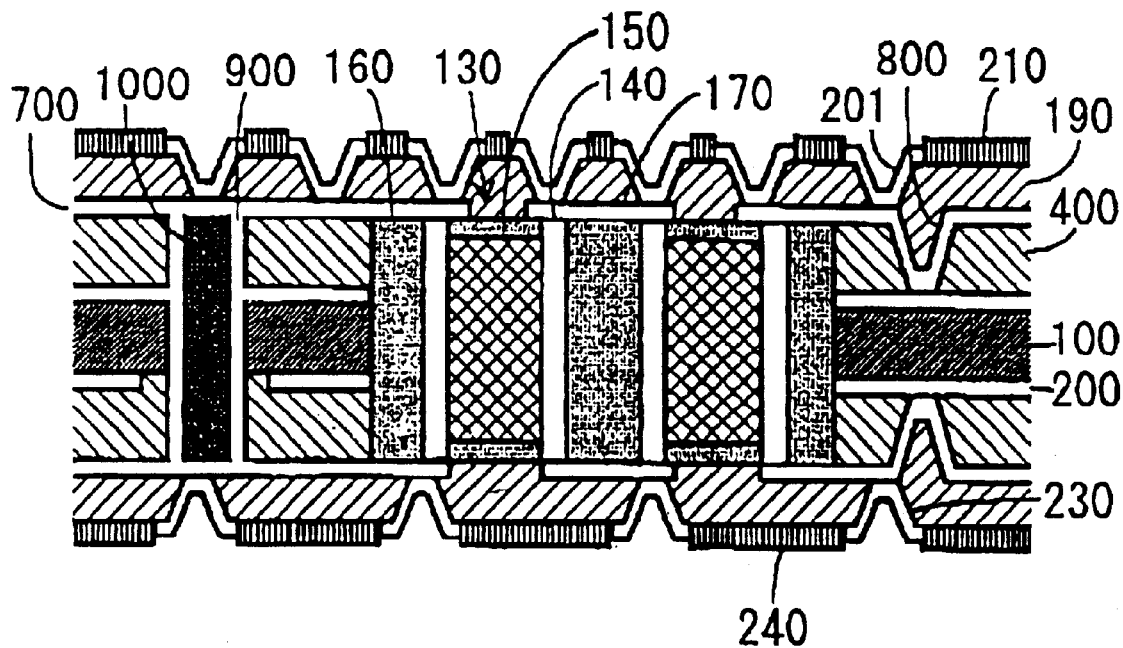
FIG. 24 is an explanatory view showing the state after a build-up layer and a solder resist layer have been formed on the substrate according to the present invention.
Figure 25:
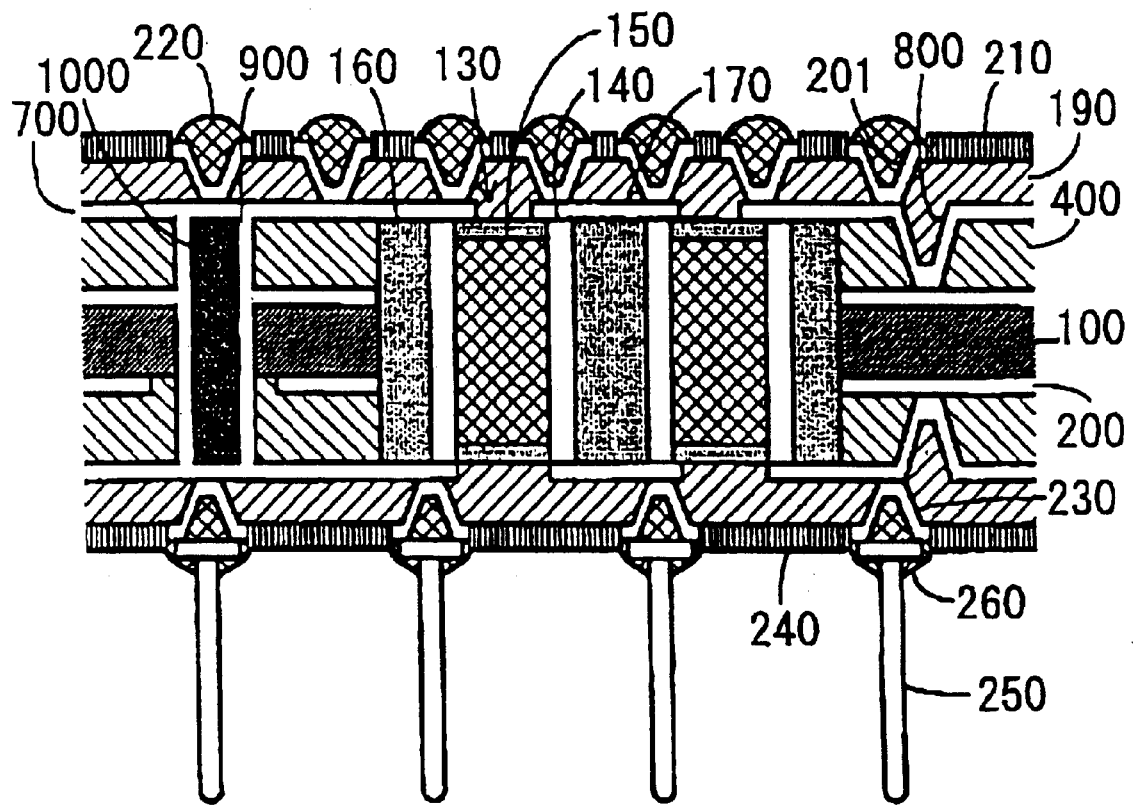
FIG. 25 is an explanatory view showing an embodiment of a FC-PGA-type multi-layer printed wiring board making use of an embedding resin of the present invention.

Thereafter, the polished surface of the embedding resin (160) is roughed by use of a swelling solution and a $KMnO_4$ solution. After the roughed surface is activated by use of a Pd catalyst, the surface is subjected to electroless plating and then electroplating, to thereby form a copper plating layer. As shown in FIG. 22, the plating layer (170) formed on the embedding resin (160) is electrically connected to the end surfaces of the electrodes (140) of the chip capacitors (130). A resist (not illustrated) is formed on the plating layer, and a predetermined wiring pattern is formed through patterning. Unwanted copper is removed through etching by use of $Na_2S_2O_8$/concentrated sulfuric acid. Subsequently, the resist is removed, to thereby complete formation of wiring as shown in FIG. 23. The surface of the resultant copper wiring is roughed through etching by use of a commercially available etching apparatus (CZ treatment apparatus, product of Mec).

On the copper wiring, a film (190) to serve as an insulating layer is laminated, and then cured through heating. Thereafter, the film is irradiated with a carbon dioxide gas laser, to thereby form via holes for connecting layers. The surface of the insulating layer is roughed by use of the aforementioned oxidizing agent, and predetermined wiring (201) is formed on the insulating layer in a manner similar to that described above. A dry film which is to serve as a solder resist layer is laminated on the outermost surface of the wiring substrate, and a mounting pattern of a semiconductor element is formed on the dry film through exposure and development, to thereby form a solder resist layer (210). On the bottom surface of the substrate to which pins for mounting are to be attached, predetermined wiring (230) and a solder resist layer (240) are formed in a manner similar to that described above, to thereby produce a multi-layer printed wiring board shown in FIG. 24 on which the pins are not attached.

Terminal electrodes (201) on which a semiconductor element is to be mounted are subjected to Ni plating and then Au plating (not illustrated). After a solder paste containing low-melting-point solder is printed on the plated electrodes, solder bumps (220) for mounting a semiconductor element are formed through use of a solder reflow furnace.

On the surface opposite to the surface on which a semiconductor element is to be mounted, a solder paste containing high-melting-point solder is printed, and then solder bumps (260) for attaching pins are formed through use of a solder reflow furnace. While the wiring board is provided on pins (250) set on a jig (not illustrated), the wiring board is placed in a solder reflow furnace (not illustrated), to thereby attach the pins to the wiring board, the process thus produces an FC-PGA-type multi-layer printed wiring board shown in FIG. 25 to which a semiconductor element is not attached. The distance between the position of the tip of each of the pins (250), which are attached on the region corresponding to the opening (110) (which has been filled with the embedding resin (160)) and the position of the tip as planned is 0.1 mm or less, which is practically acceptable, as measured by use of a projector.

A semiconductor element (270) is disposed on a position of the surface of the wiring board such that the element can be mounted on the wiring board, and then the wiring board is placed in a solder reflow furnace and heated at a temperature at which only the low-melting-point solder (220) is melted, to thereby mount the semiconductor element (270) on the wiring board. Subsequently, the mounted portion is filled with an underfill material (300) by use of a dispenser, and then the material is cured through heating, to thereby produce a semiconductor device shown in FIG. 11 including the FC-PGA-type multi-layer printed wiring board on which the semiconductor element (270) is mounted.

EXAMPLES

The present invention will next be described by way of Examples. An embedding resin was prepared as follows: components were weighed so as to attain a formulation shown in Table 1 and mixed together, and the resultant mixture was kneaded by use of a three-roll mill. Items shown in Table 1 will next be described in detail.

TABLE 1

| Sample No. | 1 | 2 | 3 | 4 | 5 | 6 | 7 | 8 | 9 |
|---|---|---|---|---|---|---|---|---|---|
| Epoxy resin | HP-4032D | HP-4032D | E-807 | YL-980 | HP-4032D | N-740 | HP-4032D | E-152 | N-740 |
| Curing agent | QH-200 | B-570 | QH-200 | B-650 | YH-306 | YH-300 | YH-300 | B-650 | B-650 |
| Accelerator | 2P4MHZ | 2P4MHZ | 2P4MHZ | 2P4MHZ | 2P4MHZ | 2P4MHZ | 2P4MHZ | 2P4MHZ | 2P4MHZ |
| Filler | TSS-6 | TSS-6 | TSS-6 | TSS-6 | TSS-6 | TSS-6 | TSS-6 | TSS-6 | TSS-6 |
| Content | 65% | 65% | 65% | 65% | 65% | 65% | 65% | 65% | 65% |
| Carbon | #4300 | #4300 | #4300 | #4300 | #4300 | #4300 | #4300 | #4300 | #4300 |
| Content | 0% | 0.1% | 0.2% | 0.3% | 0.5% | 1.0% | 1.5% | 2.0% | 2.5% |

The Epoxy resin used and shown in Table 1 was:
HP-4032D-naphthalene-type epoxy resin of high purity (product of Dainippon Ink and Chemicals, Inc.)
E-807-bisphenol-F-type epoxy resin (product of Yuka Shell)
YL-980-bisphenol-A-type epoxy resin (product of Yuka Shell)
N-740-phenol-novolak-type epoxy resin (product of Dainippon Ink and Chemicals, Inc.)
The Curing agent used and shown in Table 1 was:
QH-200-acid anhydride-based curing agent (product of Nippon Zeon Co., Ltd.)
B-570-acid anhydride-based curing agent (product of DIC)
B-650-acid anhydride-based curing agent (product of DIC)
YH-306-acid anhydride-based curing agent (product of Yuka Shell Epoxy K.K.)
YH-300-acid anhydride-based curing agent (product of Yuka Shell Epoxy K.K.)
The Accelerator (curing accelerator) used and shown in Table 1 was 2P4MHZ, which is an imidazole-based curing agent (product of Shikoku Corporation).
The Inorganic filler used and shown in Table 1 was TSS-6, which is a silane-coupled filler (product of Tatsumori, maximum particle size as measured by means of particle size distribution: 24 $\mu$m).
The Carbon black used and shown in Table 1 was #4300, which is a product of Tokai Carbon Co., Ltd.
"Carbon content" represents the amount of carbon when the total of the amounts of epoxy resin, curing agent, and inorganic filler is taken as 100 mass %. The carbon content of each sample is shown in Table 1. "Filler content" is 65 mass %, with the total of the amounts of epoxy resin, curing agent, and filler being taken as 100 mass %. The accelerator content is 0.1 mass %, with the total of the amounts of epoxy resin, curing agent, and filler being taken as 100 mass %. The ratio, on a functional group basis, of the epoxy resin to the curing agent is 100/95. The balance represents the total of the amounts of the epoxy resin and the curing agent. Each of the embedding resin compositions shown in Table 1 was evaluated as follows.
A sample for evaluation of dielectric constant and dielectric loss was prepared as follows. First, through screen printing an embedding resin was printed on a copper plate for Hull cell test so as to attain a width of 60 mm, a length of 90 mm, and a thickness of 100 $\mu$m. Subsequently, the resin was defoamed and cured by the following three heating steps: heating at 100° C. for 80 minutes, at 120° C. for 60 minutes, and at 160° C. for 10 minutes. A silver paste was applied onto the cured resin through screen printing so as to attain a diameter of 20 mm. The resultant sample was subjected to measurement of dielectric constant and tan δ by use of an impedance/gain phase analyzer (using an HP4194A model, product of HEWLETT PACKARD).

A sample for evaluation of volume resistance was prepared as follows. Firstly, through screen printing an embedding resin was printed on a copper plate for Hull cell test so as to attain a width of 60 mm, a length of 90 mm, and a thickness of 100 μm. Subsequently, the resin was defoamed and cured by the following three heating steps: heating at 100° C. for 80 minutes, at 120° C. for 60 minutes, and at 160° C. for 10 minutes. The resultant sample was subjected to measurement of volume resistance by use of a high resistance meter (using a HP4339B model, product of HEWLETT PACKARD). For measurement of volume resistance, a resistivity cell having a diameter of 26 mm was employed, charging time was set to 20 seconds, and output voltage was set to 100 V.

A sample for evaluation of yield during exposure and development and for evaluation of volume resistance was prepared as follows. First, the surface of the above-prepared plate sample was roughed by use of a swelling solution and a $KMnO_4$ solution. The roughed surface was activated by use of a Pd catalyst, and then subjected to electroless plating and electroplating, to thereby form a copper plating layer. A resist was formed on the plating layer, and subjected to exposure and development, to thereby form a comb-shaped wiring pattern having a line width of 40 μm and a line space of 20 μm. Unwanted copper was removed through etching by use of $Na_2S_2O_8$/concentrated sulfuric acid. Thereafter, the resist was exfoliated to thereby complete formation of the wiring. The percentage of the samples which have been passed is referred to as "exposure yield."

Criteria for determining whether the samples have been passed in the aforementioned evaluations are described below. The evaluation results are shown in Table 2, with the following specification Volume resistance: $1.0 \times 10^{14}$ Ω·cm or more Dielectric constant: 5.0 or less tan δ: 0.08 or less Exposure yield: 95% or more somewhat low volume resistance, elevated dielectric constant and tan δ, and relatively low exposure yield.

The embedding resin of the present invention exhibits excellent dielectric properties; i.e., the resin has tan δ of 0.08 or less and a dielectric constant of 5 or less. In addition, the embedding resin has a volume resistance as high as $1.0 \times 10^{14}$ Ω·cm. When the amount of carbon incorporated in the embedding resin is 1.4 mass % or less, the resin exhibits an excellent insulating property; i.e., the resin has a volume resistance of $1.0 \times 10^{14}$ Ω·cm. As described above, the embedding resin exhibits excellent dielectric properties; i.e., high volume resistance, low tan δ, and low dielectric constant, and also exhibits excellent electrical properties. Furthermore, the embedding resin can prevent random reflection of light during formation of a wiring pattern through exposure, to thereby increase production yield of a wiring board.

It will be apparent to those skilled in the art that various modifications and variations can be made in the embedding resin of the present invention without departing from the spirit or scope of the invention. Thus, it is intended that the present invention cover the modifications and variations of this invention provided they come within the scope of the appended claims and their equivalents.

What is claimed is:

1. An embedding resin having a dielectric constant of about 5 or less and tan δ of about 0.08 or less at a frequency level of 1 MHz.

wherein the embedding resin assumes a color having a base color tone selected from among black, blue, green, red, orange, yellow, and violet.

2. The embedding resin according to claim 1, further comprising carbon black in an amount of 1.4 mass % or less.

3. The embedding resin according to claim 1, further comprising a thermosetting resin as a resin component and at least one inorganic filler.

4. The embedding resin according to claim 2, further comprising a thermosetting resin as a resin component and at least one inorganic filler.

5. The embedding resin according to claim 3, wherein the thermosetting resin is at least one species selected from among a bisphenol epoxy resin, a naphthalene epoxy resin, a phenol-novolak epoxy resin, and cresol-novolakil epoxy resin.

6. A wiring board in which electronic parts are embedded by use of an embedding resin, comprising:

TABLE 2

| Sample No. | 1 | 2 | 3 | 4 | 5 | 6 | 7 | 8 | 9 |
|---|---|---|---|---|---|---|---|---|---|
| Volume resistance (×10$^{14}$ Ω · cm) | 15.4 | 53.0 | 22.2 | 14.6 | 14.7 | 7.82 | 17.1 | 9.82 | $9.25 \times 10^{-5}$ |
| Dielectric constant | 3.78 | 3.83 | 3.88 | 3.98 | 4.07 | 4.42 | 5.46 | 5.78 | 7.27 |
| Evaluation | ○ | ○ | ○ | ○ | ○ | ○ | Δ (some samples are not passed) | Δ (some samples are not passed) | X |
| tan δ | 0.010 | 0.012 | 0.017 | 0.022 | 0.031 | 0.047 | 0.087 | 0.107 | 0.194 |
| Evaluation | ○ | ○ | ○ | ○ | ○ | ○ | X | X | X |
| Exposure yield | 95% | 98% | 97% | 97% | 98% | 97% | 95% | 96% | 95% |
| Evaluation | ○ | ○ | ○ | ○ | ○ | ○ | ○ | ○ | ○ |

The results show that sample Nos. 1 through 6 (Examples) are excellent in terms of all the evaluation items. In contrast, sample Nos. 7 through 9 (Comparative Examples) in which the carbon black content exceeds 1.4 mass % showed a through hole formed on a core substrate such that electronic parts can be mounted in the hole;

a plurality of electronic parts mounted in the hole; and a wiring pattern formed on the embedding resin and connected to the electronic parts.

wherein the embedding resin has a dielectric constant of about 5 or less and tan δ of about 0.08 or less at a frequency of 1 MHz.

wherein the embedding resin assumes a color having a base color tone selected from among black, blue, green, red, orange, yellow, and violet, and wherein the embedding resin is fed into spaces between the through hole and the plurality of electronic parts.

7. The wiring board according to claim 6, wherein the embedding resin comprises carbon black in an amount of 1.4 mass % or less.

8. The wiring board according to claim 6, wherein the embedding resin comprises a thermosetting resin as a resin component and at least on inorganic filler.

9. The wiring board according to claim 8, wherein the thermosetting resin is at least one species selected from among a bisphenol epoxy resin, a naphthalene epoxy resin, a phenol-novolak epoxy resin, and cresol-novolak epoxy resin.

10. The embedding resin according to claim 3, wherein the at least one inorganic filler has a particle size range of about 0.1 μm to 50 μm.

11. The wiring board according to claim 8, wherein the at least one inorganic filler has a particle size range of about 0.1 μm to 50 μm.

12. The wiring board according to claim 6, wherein the electronic part is a capacitor.

13. A method of making a wiring board, the method comprising:

providing a core substrate;

forming a through hole in the core substrate;

mounting an electronic part in the through hole;

feeding an embedding resin into spaces between the through hole and the electronic part mounted in the through hole; and forming a wiring pattern on the embedding resin through an exposure process, wherein the embedding resin has a dielectric constant of about 5 or less and tan δ of about 0.08 or less at a frequency level of 1 MHz, and wherein the embedding resin assumes a color having a base color tone selected from among black, blue, green, red, orange, yellow, and violet.

14. The method of making a wiring board according to claim 13, wherein the embedding resin comprises carbon black in an amount of 1.4 mass % or less.

15. A method of making a wiring board as claimed in claim 13, further comprising:

applying a backing tape on the core substrate; and mounting the electronic part on an adhesive surface of the backing tape.

16. The method of making a wiring board according to claim 13, wherein the embedding resin comprises a thermosetting resin as a resin component and at least one inorganic filler.

17. The method of making a wiring board according to claim 16, wherein the thermosetting resin is at least one species selected from among a bisphenol epoxy resin, a naphthalene epoxy resin, a phenol-novolak epoxy resin, and a cresol-novolak epoxy resin.

* * * * *